(12) United States Patent
Kariya et al.

(10) Patent No.: US 8,415,781 B2
(45) Date of Patent: Apr. 9, 2013

(54) ELECTRONIC COMPONENT AND METHOD FOR MANUFACTURING THE SAME

(75) Inventors: Takashi Kariya, Ogaki (JP); Toshiki Furutani, Ogaki (JP); Shinobu Kato, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 63 days.

(21) Appl. No.: 13/205,027

(22) Filed: Aug. 8, 2011

(65) Prior Publication Data

US 2012/0032335 A1 Feb. 9, 2012

Related U.S. Application Data

(60) Provisional application No. 61/371,819, filed on Aug. 9, 2010.

(51) Int. Cl.
*H01F 5/00* (2006.01)
*H01L 23/48* (2006.01)

(52) U.S. Cl.
USPC ........... 257/678; 257/700; 257/772; 257/774; 257/784; 257/E21.506; 257/E23.011; 361/306.3; 438/107; 438/108; 438/126; 438/613; 174/260; 174/261; 174/267

(58) Field of Classification Search .................. 257/678, 257/700, 772, 774, 784, E21.506, E23.011; 361/306.3; 438/107, 108, 126, 613; 174/260, 174/261, 267
See application file for complete search history.

(56) References Cited

U.S. PATENT DOCUMENTS

| | | | | |
|---|---|---|---|---|
| 6,611,419 | B1* | 8/2003 | Chakravorty | 361/306.3 |
| 7,035,081 | B2* | 4/2006 | Nagata et al. | 361/306.3 |
| 7,345,246 | B2* | 3/2008 | Muramatsu et al. | 174/260 |
| 8,242,612 | B2* | 8/2012 | Horiuchi et al. | 257/784 |
| 2005/0263867 | A1* | 12/2005 | Kambe et al. | 257/678 |
| 2011/0100700 | A1* | 5/2011 | Kariya et al. | 174/267 |

FOREIGN PATENT DOCUMENTS

JP  3773896  2/2006

* cited by examiner

*Primary Examiner* — Dao H Nguyen
(74) *Attorney, Agent, or Firm* — Oblon, Spivak, McClelland, Maier & Neustadt, L.L.P.

(57) ABSTRACT

An electronic component including a wiring board having a power-source pattern and a signal pattern, a semiconductor element mounted on the wiring board and having a power-source electrode pad and a signal electrode pad, a first connection portion being made of a conductive material and connecting the signal pattern of the wiring board and the signal electrode pad of the semiconductor element, and a second connection portion being made of a conductive material and connecting the power-source pattern of the wiring board and the power-source electrode pad of the semiconductor element. The conductive material of the first connection portion and the conductive material of the second connection portion are selected such that the conductive material of the second connection portion has an electrical resistance which is lower than an electrical resistance of the conductive material of the first connection portion.

17 Claims, 9 Drawing Sheets

ELECTRONIC COMPONENT AND METHOD FOR MANUFACTURING THE SAME

CROSS-REFERENCE TO RELATED APPLICATIONS

The present application claims the benefits of priority to U.S. Application No. 61/371,819, filed Aug. 9, 2010. The contents of that application are incorporated herein by reference in their entirety.

BACKGROUND OF THE INVENTION

1. Field of the Invention

The present invention relates to an electronic component formed by mounting a semiconductor element on a wiring board and to its manufacturing method.

2. Discussion of the Background

In Japanese Patent Publication No. 3773896, an electronic component formed by flip-chip mounting a semiconductor chip (semiconductor element) on a wiring board is described. In the present application, the contents of Japanese Patent Publication No. 3773896 are incorporated herein by reference in their entirety.

SUMMARY OF THE INVENTION

According to one aspect of the present invention, an electronic component includes a wiring board having a power-source pattern and a signal pattern, a semiconductor element mounted on the wiring board and having a power-source electrode pad and a signal electrode pad, a first connection portion being made of a conductive material and connecting the signal pattern of the wiring board and the signal electrode pad of the semiconductor element, and a second connection portion being made of a conductive material and connecting the power-source pattern of the wiring board and the power-source electrode pad of the semiconductor element. The conductive material of the first connection portion and the conductive material of the second connection portion are selected such that the conductive material of the second connection portion has an electrical resistance which is lower than an electrical resistance of the conductive material of the first connection portion.

According to another aspect of the present invention, a method for manufacturing an electronic component includes forming a first conductive pattern on a first surface of an insulation layer, forming a first connection portion made of a conductive material on the first conductive pattern, positioning on the insulation layer a semiconductor element having a signal electrode pad and a power-source electrode pad such that the signal electrode pad of a semiconductor element is electrically connected to the first conductive pattern through the first connection portion, filling an underfill material in a space between the semiconductor element and the insulation layer, forming an opening portion which penetrates through the insulation layer and reaches the power-source electrode pad of the semiconductor element, forming in the opening portion a second connection portion made of a conductive material such that the second conductive pattern is connected to the power-source electrode pad, and forming a second conductive pattern on a second surface of the insulation layer. The conductive material of the first connection portion and the conductive material of the second connection portion are selected such that the conductive material of the second connection portion has an electrical resistance which is lower than an electrical resistance of the conductive material of the first connection portion.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
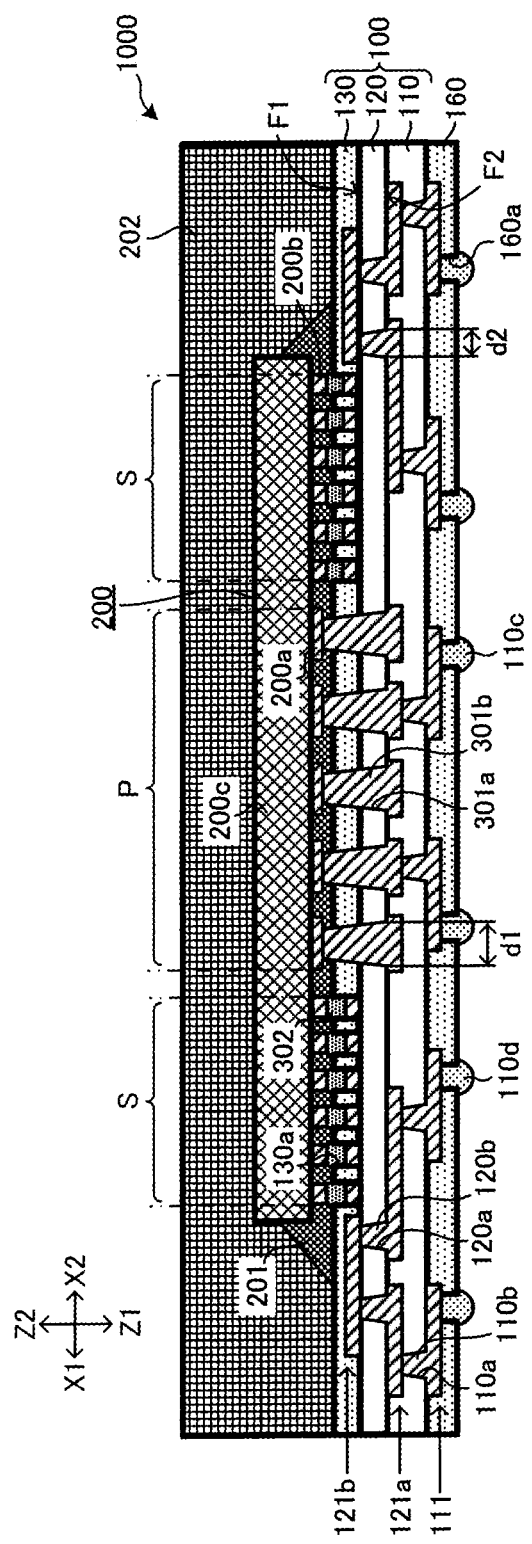
FIG. 1 is a cross-sectional view showing an electronic component according to the first embodiment of the present invention.

The embodiments will now be described with reference to the accompanying drawings, wherein like reference numerals designate corresponding or identical elements throughout the various drawings.

In the drawings, arrows (Z1, Z2) each indicate a lamination direction, corresponding to a direction along a normal line (or a thickness direction) to the main surfaces (upper and lower surfaces) of each layer. On the other hand, arrows (X1, X2)
} and (Y1, Y2) each indicate a direction perpendicular to a lamination direction (directions parallel to the main surfaces of each layer). The main surfaces of each layer are on the X-Y plane. Side surfaces of each layer are on the X-Z plane or the Y-Z plane.

Two main surfaces facing opposite directions of a normal line are referred to as a first surface (the Z2-side surface) and a second surface (the Z1-side surface). Namely, a main surface opposite the first surface is the second surface, and a main surface opposite the second surface is the first surface.

Regarding via conductors or their holes (via holes), a cross section perpendicular to directions Z (X-Y plane) is referred to as a horizontal cross section. Also, a cross section parallel to directions Z (X-Z plane or Y-Z plane) is referred to a vertical cross section.

Conductive patterns may include wiring that forms conductive circuits (including ground), pads, lands and so forth, or may be plain patterns that do not form conductive circuits. In addition, in a wiring board with a built-in electronic component or wiring board, conductive patterns include electrodes of the electronic components and pads of another wiring board.

Opening portions include notches, slits and so forth in addition to holes and grooves. Holes are not limited to penetrating holes but non-penetrating holes are also included. Holes include via holes and through holes. Conductor formed inside a via hole is referred to as a via conductor, and conductor formed inside a through hole is referred to as a through-hole conductor.

Among the conductors formed in opening portions (such as via conductors and through-hole conductors), conductive film formed on inner surfaces (side and bottom surfaces) of an opening portion is referred to as a conformal conductor, and conductor filled in an opening portion is referred to as a filled conductor.

Plating indicates depositing a layer of conductor (such as metal) on surfaces of metal, resin or the like as well as the deposited conductive layer (such as a metal layer). Plating includes wet plating such as electrolytic plating as well as dry plating such as PVD (physical vapor deposition) and CVD (chemical vapor deposition).

First Embodiment

Figure 2:
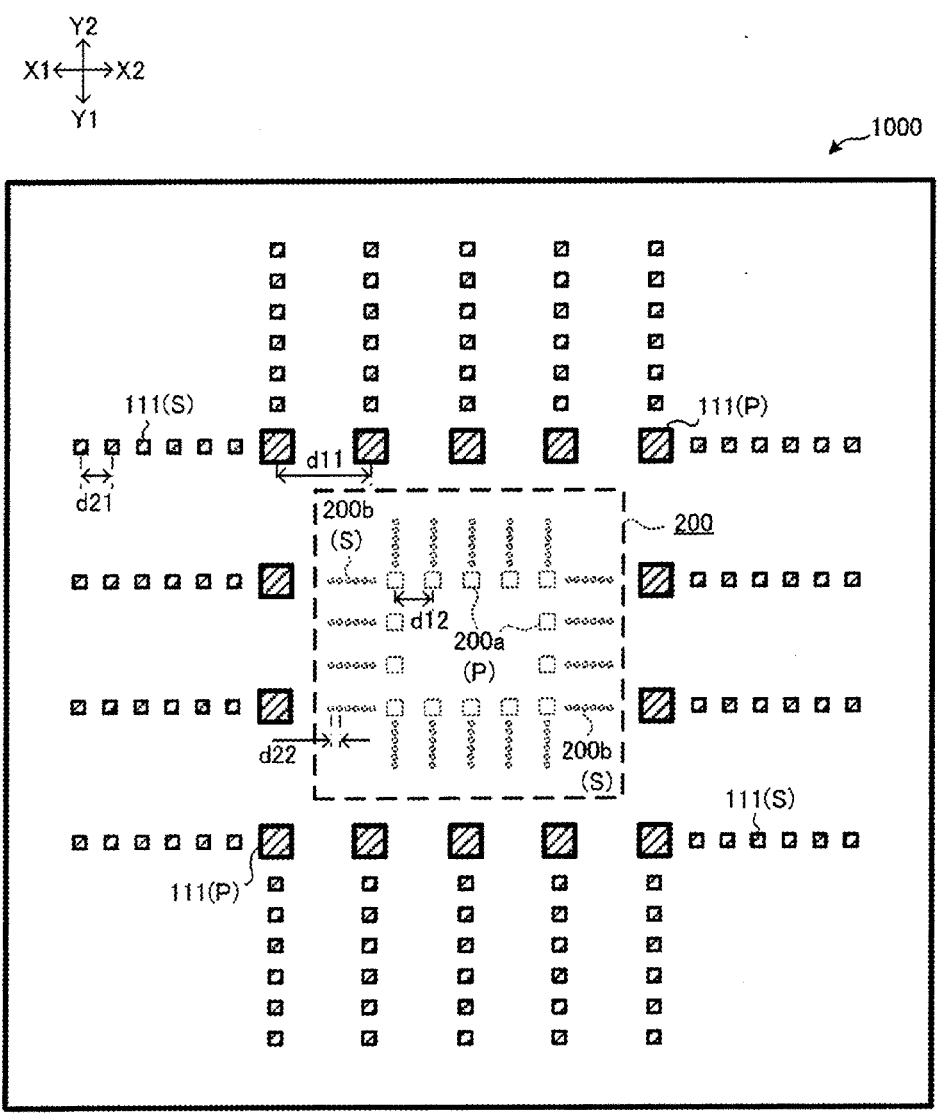
FIG. 2 is a plan view showing an electronic component according to the first embodiment of the present invention.

As shown in FIGS. 1 and 2, electronic component 1000 of the present embodiment has wiring board 100, semiconductor chip 200 (semiconductor element) and encapsulating resin 202. Wiring board 100 and semiconductor chip 200 are electrically connected to each other. Specifically, their power-source patterns (P) are electrically connected by multiple via conductors (301b). Also, signal patterns (S) are electrically connected by multiple bumps 302. In the present embodiment, the pitch of signal patterns (S) is set narrower than the pitch of power-source patterns (P). Bumps 302 of signal patterns (S) are formed with a pitch of 90 μm or less, for example. In the present embodiment, bumps 302 correspond to first connection portions.

In the present embodiment, bumps 302 are made of solder, and via conductors (301b) are made of copper having a lower electrical resistance than the solder. However, those materials are not limited specifically, as long as the electrical resistance of the material for via conductors (301b) is lower than the electrical resistance of the material for bumps 302.

Wiring board 100 is a coreless wiring board. Namely, wiring board 100 does not have a core substrate. Wiring board 100 is shaped as a flat sheet with four sides of approximately 40 mm each, for example.

In particular, wiring board 100 has insulation layers (110, 120), solder resist 130, conductive patterns (111, 121a, 121b) and via conductors (110b, 120b).

Conductive pattern (121a) (second conductive pattern) is formed on second surface (F2) of insulation layer 120, and conductive pattern (121b) (first conductive pattern) is formed on first surface (F1) of insulation layer 120. Conductive pattern (121b) is formed with the signal pattern, and conductive pattern (121a) includes the power-source pattern and the signal pattern.

Insulation layer 110 (second insulation layer) is formed on second surface (F2) of insulation layer 120 and on conductive pattern (121a). Also, conductive pattern 111 (third conductive pattern) is formed on insulation layer 110.

Solder resist 130 is formed on first surface (F1) of insulation layer 120. Solder resist 130 has opening portions (130a). At least portions of conductive pattern (121b) are exposed through opening portions (130a). The exposed portions function as solder pads.

Insulation layers (110, 120) are made of resin. As for the resin to form insulation layers (110, 120), for example, epoxy resin and polyimide resin are listed. The thermal expansion coefficient of insulation layers (110, 120) is preferred to be 2~10 ppm to reduce thermal stress generated by differences in the thermal expansion coefficient with the semiconductor chip. Solder resist 130 is made of resin such as photosensitive resin using acrylic-epoxy resin, thermosetting resin primarily containing epoxy resin, UV-curing resin or the like, for example.

Holes (110a, 120a) (via holes) are formed in insulation layers (110, 120) respectively. Then, by filling conductor (such as copper plating) in holes (110a, 120a), the conductor in holes (110a, 120a) becomes via conductors (110b, 120b) (they are filled conductors). Conductive pattern 111 and conductive pattern (121a) are electrically connected to each other by via conductors (110b) (third via conductors). Also, conductive pattern (121a) and conductive pattern (121b) are electrically connected to each other by via conductors (120b) (first via conductors).

The shape of via conductors (110b, 120b) is, for example, a tapered column (truncated cone) with a diameter decreasing from the second-surface side toward the first-surface side. Namely, the horizontal cross section (X-Y plane) of via conductors (110b, 120b) is shaped to be a complete circle, for example, and the vertical cross section is shaped to be a trapezoid, for example. However, the shape of via conductors (110b, 120b) is not limited specifically, and it may also be a non-tapered column, for example.

Conductive patterns (111, 121a, 121b) are double-layered with electroless copper plating (lower layer) and electrolytic copper plating (upper layer), for example. However, the material for conductive patterns (111, 121a, 121b) is not limited specifically, and copper foil may further be formed underneath the electroless plating, for example. Alternatively, conductive patterns (111, 121a, 121b) may also be formed only with copper electroless plating. Yet alternatively, the material for conductive patterns (111, 121a, 121b) may be a conductor other than copper.

Bumps 302 are positioned on conductive pattern (121b) exposed through opening portions (130a) in solder resist 130. As described above, bumps 302 are solder bumps, for example. Semiconductor chip 200 is mounted on bumps 302 through flip-chip mounting, for example. In particular, semiconductor chip 200 has chip body (200c), multiple electrode pads (200a) of power-source pattern (P) (power-source electrode pads) and multiple electrode pads (200b) of signal pattern (S) (signal electrode pads). Among them, electrode pads (200b) (electrodes of signal pattern (S)) and a conductive pattern (pads of signal pattern (S) in wiring board 100) are electrically connected to each other through bumps 302. Semiconductor chip 200 is an IC chip in which elements such as a resistor, diode, transistor and capacitor are integrated, for example.

Electrode pads (200a, 200b) of semiconductor chip 200 are formed at predetermined spots on chip body (200c) (see FIG. 2, for example). Between wiring board 100 and semiconductor chip 200, insulative underfill material 201 is filled to mitigate mismatching of thermal expansion coefficients. Also, semiconductor chip 200 is encapsulated with encapsulating resin 202 (molding resin). Encapsulating resin 202 is made of epoxy resin, for example.

Via conductors (301b) as second connection portions electrically connect electrode pads (200a) of semiconductor chip 200 (electrodes of power-source pattern (P)) and conductive pattern (121a). Specifically, holes (301a) (via holes) are formed penetrating through insulation layer 120 (outermost interlayer insulation layer), solder resist 130 and underfill material 201 and reaching electrode pads (200a). Then, by filling conductor (such as copper plating) in holes (301a), the conductor in holes (301a) becomes via conductors (301b) (filled conductors). Namely, via conductors (301b) penetrate through insulation layer 120 (outermost interlayer insulation layer), solder resist 130 and underfill material 201. Accordingly, electrode pads (200a) of semiconductor chip 200 and conductive pattern (121a) are electrically connected to each other. Via conductors (301b) and conductive pattern (121a) are formed to be contiguous, for example (see later-described FIGS. 10, 11).

The shape of via conductors (301b) is, for example, a tapered column (truncated cone) with a diameter decreasing from the side of conductive pattern (121a) toward electrode pads (200a). Namely, the horizontal cross section (X-Y plane) of via conductors (301b) is a complete circle, for example, and the vertical cross section is a trapezoid, for example. However, the shape of via conductors (301b) is not limited specifically, and it may also be a non-tapered column.

In the present embodiment, via conductors (301b) of power-source pattern (P) and via conductors (120b) of signal pattern (S) both taper in the same direction. Thus, via conductors (301b, 120b) along with holes to form via conductors (301b, 120b) may be formed simultaneously (see later-described FIGS. 10, 11).

Width (d1) (diameter) of via conductors (301b) (via conductors of power-source pattern (P)) is set greater than width (d2) (diameter) of via conductors (120b) (via conductors of signal pattern (S)) formed in insulation layer 120 (interlayer insulation layer in wiring board 100). Therefore, electrical resistance in power-source pattern (P) is reduced, and voltage can be supplied for the semiconductor chip without loss.

Pads are formed from conductive pattern 111 on insulation layer 110 of wiring board 100. In addition, solder resist layer 160 is formed on insulation layer 110 and conductive pattern 111. Solder resist layer 160 has opening portions (160a) which expose portions of conductive pattern 111. Bumps (110c) (third connection portions) of power-source pattern (P), which are solder bumps, for example, and bumps (110d) (third connection portions) of signal pattern (S), which are solder bumps, for example, are formed in opening portions (160a). Bumps (110c, 110d) are formed on conductive pattern 111. Pitch (d11) (FIG. 2) of bumps (110c, 110d) is approximately 12~150 μm, and is set greater than pitch (d12) (FIG. 2) of bumps 302. In electronic component 1000 of the present embodiment, by repositioning terminals through wiring board 100, terminal pitches are fanned out from semiconductor chip 200 toward pads of wiring board 100 formed from conductive pattern 111 (bumps 110c, 110d). Accordingly, semiconductor chip 200 having a fine terminal pitch can be electrically connected to a printed wiring board or the like having a wider terminal pitch.

As shown in FIG. 2, electrode pads (200a) are positioned in the central portion of semiconductor chip 200 and electrode pads (200b) are positioned outside them in the present embodiment. Namely, in the present embodiment, via conductors (301b) as the second connection portions are positioned in the approximate central portion of the projected region of semiconductor chip 200 (semiconductor element), and thus can be connected in the shortest distance with power-source electrode pads (200a) positioned in the approximate central portion of semiconductor chip 200. As a result, loss in the voltage supply for semiconductor chip 200 is reduced. However, positioning each pad is not limited specifically. Moreover, electronic components such as a capacitor may be positioned inward from the pads (conductive pattern 111) of power-source pattern (P) in wiring board 100.

In electronic component 1000 of the present embodiment, the electrical resistance of the material for via conductors (301b) of power-source pattern (P) is set lower than the electrical resistance of the material for bumps 302 of signal pattern (S). Thus, the electrical resistance in power-source pattern (P) is smaller than that in signal pattern (S). Accordingly, loss of voltage applied from, for example, a VRM (voltage regulator module) or the like to semiconductor chip 200 is reduced. As a result, applying required voltage to semiconductor chip 200 is further ensured, and malfunctions or the like of semiconductor chip 200 are suppressed from occurring.

On the other hand, since signal pattern (S) is connected to bumps 302 (especially solder bumps) which can be narrow-pitched, high-speed signal transmission is ensured.

Next, a method for manufacturing above electronic component 1000 is described. In the present embodiment, electronic component 1000 is manufactured by a method shown in FIG. 3.

Figure 4:
FIG. 4 is a view to illustrate a step for preparing a support material.

As shown in FIG. 4, support sheet 1001 (support material) is prepared in step (S11). Support sheet 1001 is, for example, copper with carrier, metal, glass, silicon, ceramics or the like. Then, adhesive layer 1002 is formed on the first surface of support sheet 1001. In the present embodiment, support sheet 1001 made of glass is used. In addition, adhesive layer 1002 is made of polyimide, for example.

Figure 3:
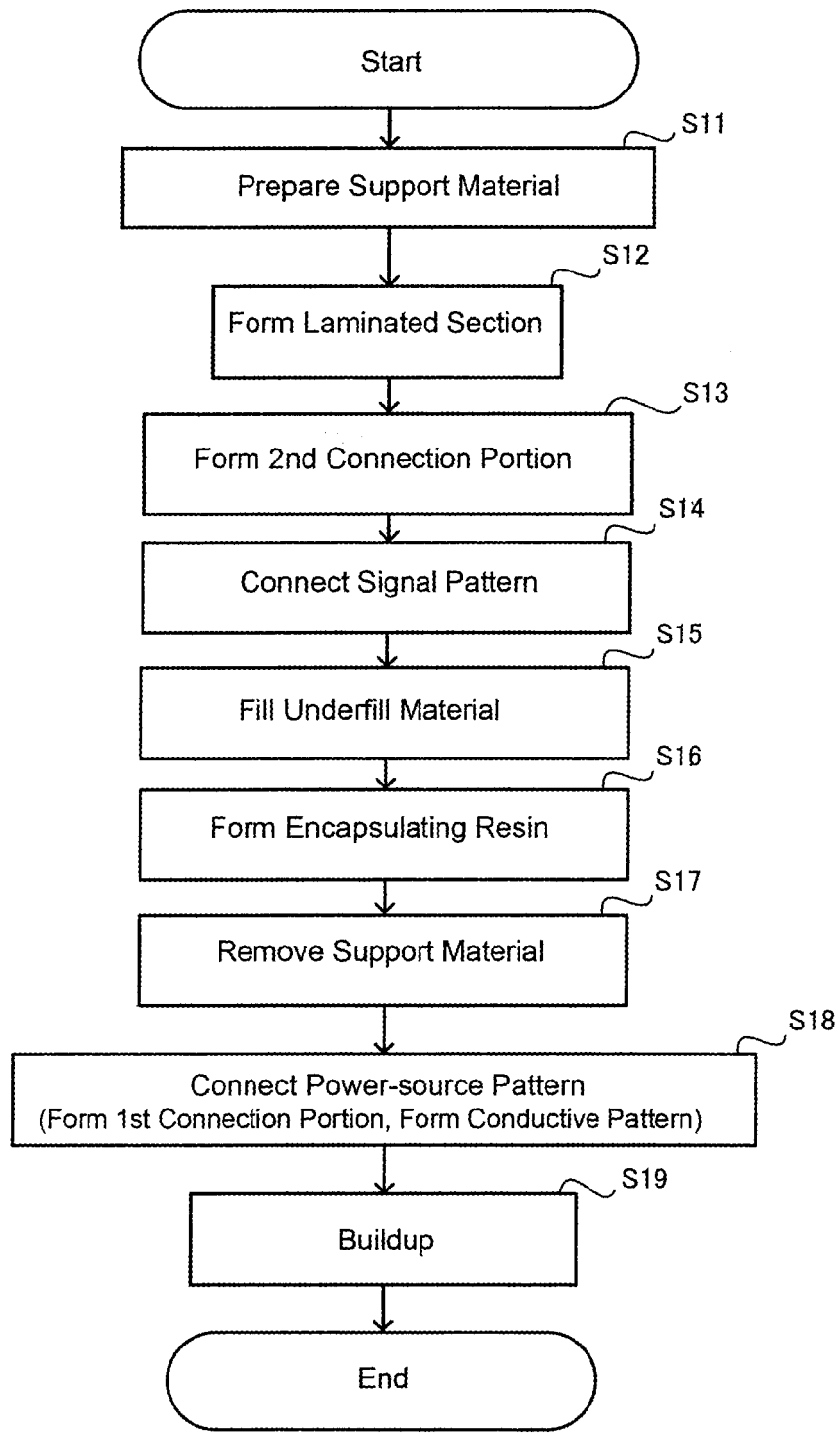
FIG. 3 is a flowchart showing a method for manufacturing an electronic component according to the first embodiment of the present invention.

In step (S12) of FIG. 3, a laminated section is formed on support sheet 1001 with adhesive layer 1002 placed in between. The laminated section is formed by alternately laminating a resin insulation layer and a conductive pattern.

Figure 5:
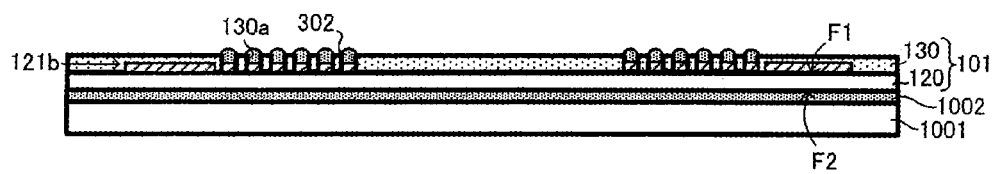
FIG. 5 is a view to illustrate a step for forming a laminated section.

Specifically, as shown in FIG. 5, insulation layer 120 (resin insulation layer) made of resin, for example, is positioned on adhesive layer 1002. Insulation layer 120 and adhesive layer 1002 are adhered through thermal treatment, for example.

Next, conductive pattern (121b) is formed on insulation layer 120 by using, for example, a full-additive method, a semi-additive (SAP) method, a subtractive method or the like. Conductive pattern (121b) is double-layered with, for example, electroless copper plating (lower layer) and electrolytic copper plating (upper layer) as described above.

Next, solder resist 130 having opening portions (130a) are formed on the first surface of insulation layer 120, for example, using a method such as screen printing, spray coating, roll coating, lamination or the like. In doing so, laminated section 101 formed with insulation layer 120, conductive pattern (121b) and solder resist 130 is formed on support sheet 1001. Conductive pattern (121b) is exposed through opening portions (130a).

In step (S13) of FIG. 3, bumps 302 are formed as first connection portions.

Next, bumps 302 are formed in opening portions (130a) in solder resist 130. Using solder plating, for example, bumps 302 are formed on conductive pattern (121b) (pads of wiring board 100) exposed through opening portions (130a) in solder resist 130. However, bumps 302 are not limited to such, and they may be formed on the side of semiconductor chip 200 instead of on the side of laminated section 101 (the side of wiring board 100).

In step (S14) of FIG. 3, signal pattern (S) of electronic component 1000 is connected (peripheral portion of the chip only).

Figure 6:
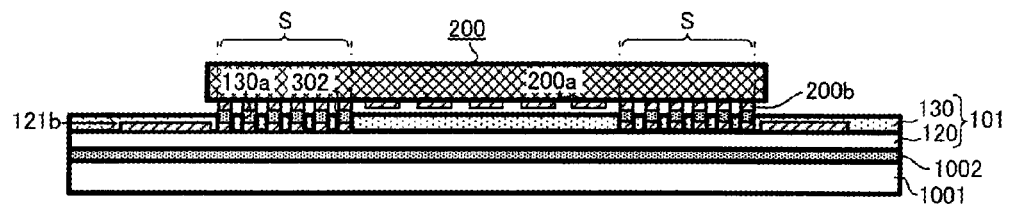
FIG. 6 is a view to illustrate a step for connecting signal lines.

Specifically, semiconductor chip 200 is prepared, then as shown in FIG. 6, semiconductor chip 200 is flip-chip mounted, for example, on conductive pattern (121b) through bumps 302. In doing so, electrode pads (200b) (the electrodes of signal pattern (S) in semiconductor chip 200) and conductive pattern (121b) (the pads of signal pattern (S) in wiring board 100) are electrically connected to each other through bumps 302. As described above, semiconductor chip 200 is an IC chip, for example.

Figure 7:
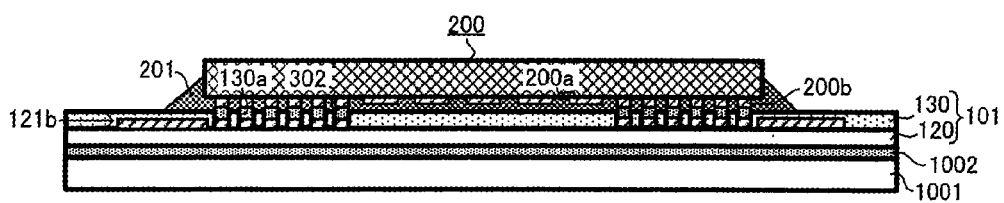
FIG. 7 is a view to illustrate a step for filling underfill material.

As shown in FIG. 7, insulative underfill material 201 is injected between wiring board 100 and semiconductor chip 200 in step (S15) of FIG. 3. In doing so, underfill material 201 is filled between wiring board 100 and semiconductor chip 200, and the connection portions (bumps 302, etc.) between wiring board 100 and semiconductor chip 200 are coated with underfill material 201.

In step (S16) of FIG. 3, encapsulating resin 202 is formed.

Figure 8:
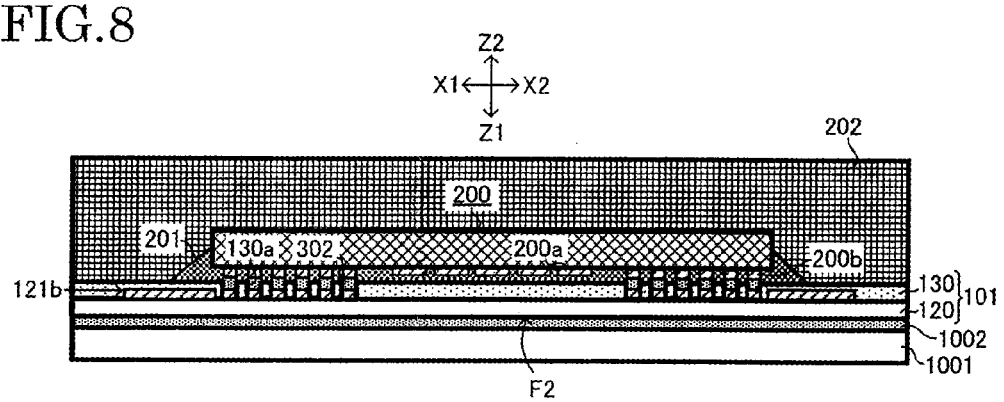
FIG. 8 is a view to illustrate a step for encapsulating a semiconductor element.

Specifically, as shown in FIG. 8, for example, encapsulating resin 202 is formed on adhesive layer 1002 to encapsulate semiconductor chip 200. Accordingly, the first surface and side surfaces of laminated section 101 are coated with encapsulating resin 202, and semiconductor chip 200 is coated with underfill material 201 and encapsulating resin 202. Namely, semiconductor chip 200 is encapsulated.

In step (S17) of FIG. 3, support sheet 1001 (support material) is removed.

Figure 9:
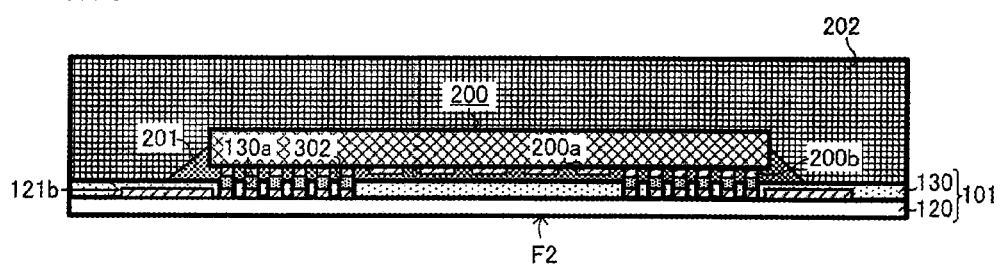
FIG. 9 is a view to illustrate a step for removing the support material.

In particular, adhesive layer 1002 is heated by a laser with glass placed in between, for example, and is slid in a direction X (or direction Y). Accordingly, as shown in FIG. 9, support sheet 1001 is removed from the second surface of laminated section 101. After support sheet 1001 is removed from laminated section 101, if adhesive layer 1002 remains on the second surface of laminated section 101, for example, then cleaning (such as ashing) is preferred to be carried out to remove such adhesive layer 1002. Also, support sheet 1001 can be used again after it is cleaned or the like.

In step (S18) of FIG. 3, power-source pattern (P) of electronic component 1000 (only the central portion of the chip) is connected.

Figure 10:
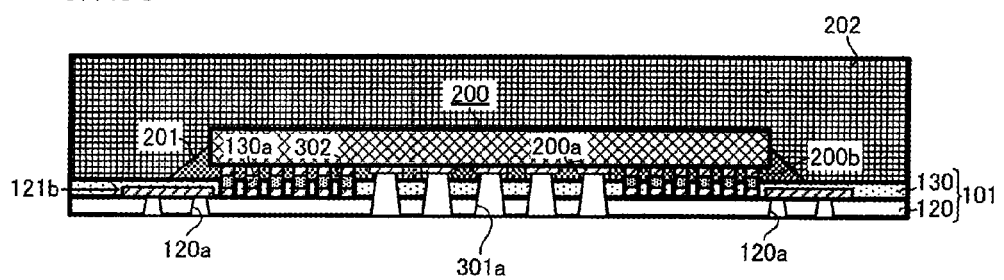
FIG. 10 is a view to illustrate a first step for connecting power supply lines.

Specifically, by irradiating laser light from the second-surface side, for example, holes (120a) (via holes) are formed in insulation layer 120 while holes (301a) (via holes) are formed in insulation layer 120, solder resist 130 and underfill material 201 as shown in FIG. 10. In the present embodiment, holes (120a) and holes (301a) are formed simultaneously. Here, holes (120a) penetrate only through insulation layer 120 and reach conductive pattern (121b). On the other hand, holes (301a) penetrate through insulation layer 120, solder resist 130 and underfill material 201 and reach electrode pads (200a) of semiconductor chip 200. Then, desmearing and soft etching are performed if required.

Figure 11:
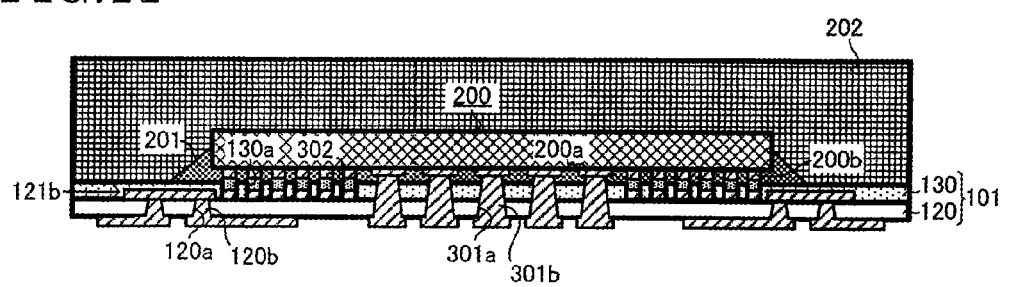
FIG. 11 is a view to illustrate a second step subsequent to the step in FIG. 10.

Next, as shown in FIG. 11, using a method such as a full-additive method, a semi-additive (SAP) method, a subtractive method or the like, via conductors (301b) (filled conductors) are formed in holes (301a) and via conductors (120b) (filled conductors) are formed in holes (120a). Furthermore, conductive pattern (121a) is formed on insulation layer 120. As described above, conductive pattern (121a) is double-layered with electroless copper plating (lower layer) and electrolytic copper plating (upper layer), for example. Accordingly, via conductors (301b) are formed, penetrating through insulation layer 120, solder resist 130 and underfill material 201, and electrode pads (200a) of semiconductor chip 200 and conductive pattern (121a) are electrically connected by via conductors (301b).

In step (S19) of FIG. 3, a buildup section is formed on the second surface of laminated section 101.

Specifically, insulation layer 110 is formed on the second surface of laminated section 101 by lamination, for example, as shown in FIG. 1. Next, holes (110a) (via holes) are formed in insulation layer 110 using a laser, for example. Then, desmearing is performed if required. Next, by a method such as a full-additive method, a semi-additive (SAP) method, a subtractive method or the like, for example, via conductors (110b) (filled conductors) are formed in holes (110a), and conductive pattern 111 is formed on insulation layer 110. As described above, conductive pattern 111 is double-layered with electroless copper plating (lower layer) and electrolytic copper plating (upper layer), for example. Accordingly, wiring board 100 is formed and electronic component 1000 is completed as previously shown in FIG. 1.

The manufacturing method according to the present embodiment is suitable for manufacturing electronic component 1000. An excellent electronic component 1000 is obtained at low cost using such a manufacturing method.

Second Embodiment

The second embodiment of the present invention is described focusing on differences with the above first embodiment. Here, the same reference number is used for the same element as that shown in above FIG. 1 and others, and a common portion already described, namely, the portion whose description would be redundant, is omitted here for convenience sake.

Figure 12:
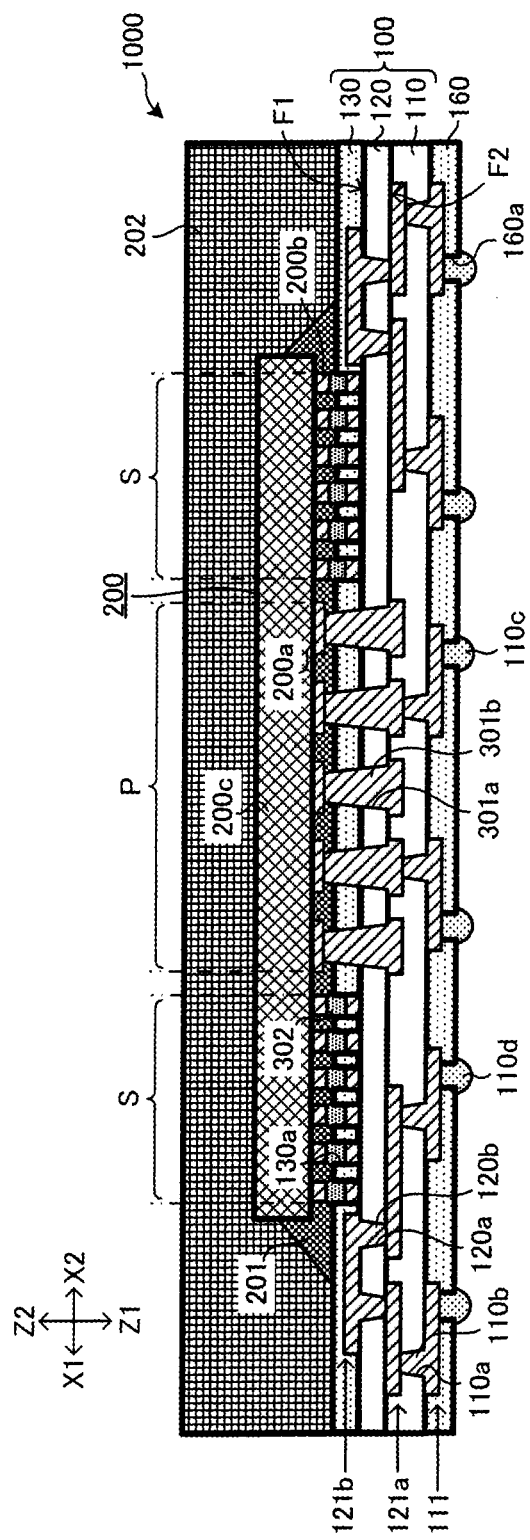
FIG. 12 is a cross-sectional view showing an electronic component according to the second embodiment of the present invention.

As shown in FIG. 12, in electronic component 1000 of the present embodiment, via conductors (301b) of power-source pattern (P) taper in a direction opposite to the tapering direction of via conductors (120b), which are formed in an interlayer resin insulation layer (insulation layer 120) of wiring board 100 and which form signal pattern (S). By forming via conductors (120b, 301b) tapering in opposite directions in wiring board 100, thermal stresses generated in wiring board 100 are considered to be offset. As a result, warping is considered to be suppressed from occurring in wiring board 100.

Next, a method is described for manufacturing electronic component 1000 according to the present embodiment. Electronic component 1000 of the present embodiment is also manufactured by a method shown in FIG. 3, for example. However, in the following procedures, the manufacturing method of the present embodiment is different from that of the first embodiment.

In the present embodiment, support sheet 1001 (support material) having adhesive layer 1002 is prepared in step (S11) of FIG. 3 the same as in the first embodiment, and then a laminated section is formed as follows in step (S12) of FIG. 3.

Figure 13:
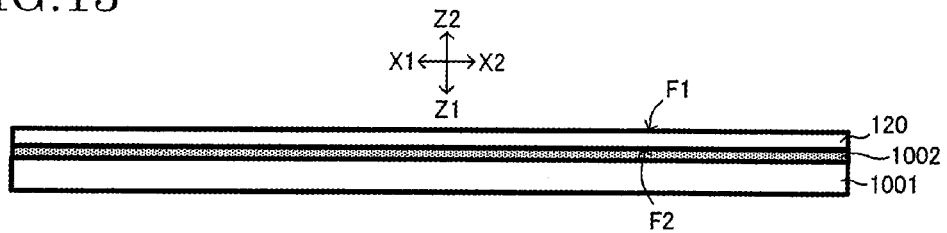
FIG. 13 is a view to illustrate a first step of a method for manufacturing an electronic component according to the second embodiment of the present invention.
Figure 14:
FIG. 14 is a view to illustrate a second step subsequent to the step in FIG. 13.

As shown in FIG. 13, insulation layer 120 (resin insulation layer) made of resin, for example, is positioned on adhesive layer 1002. Insulation layer 120 and adhesive layer 1002 are adhered through thermal treatment, for example. Next, as shown in FIG. 14, holes (120a) (via holes) are formed in insulation layer 120 by irradiating laser light from the first-surface side, for example. After that, desmearing and soft etching are performed if required. Next, using a method such as a full-additive method, a semi-additive (SAP) method, a subtractive method or the like, via conductors (120b) (filled conductors) are formed in holes (120a), while conductive pattern (121b) is formed on insulation layer 120. As described above, conductive pattern (121b) is double-layered with electroless copper plating (lower layer) and electrolytic copper plating (upper layer), for example. The shape of via conductors (120b) is a tapered column (truncated cone) with a diameter decreasing from the second-surface side toward the first-surface side, for example.

Figure 15:
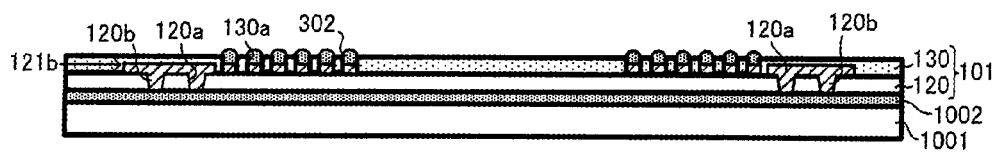
FIG. 15 is a view to illustrate a third step subsequent to the step in FIG. 14.
Figure 16:
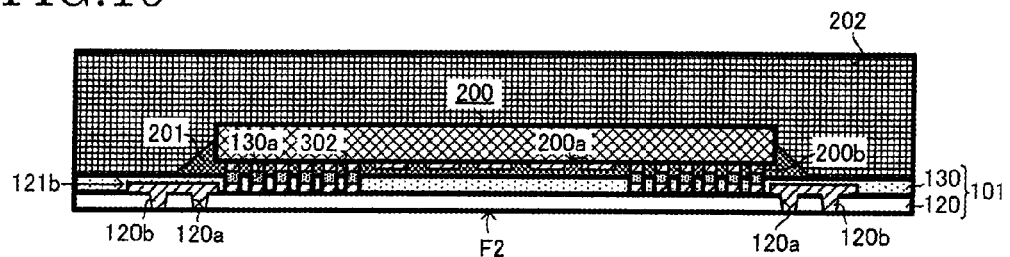
FIG. 16 is a view to illustrate a fourth step subsequent to the step in FIG. 15.

Next, as shown in FIG. 15, solder resist 130 having opening portions (130a) is formed on the first surface of insulation layer 120 through the same process as in the first embodiment. In doing so, laminated section 101 is formed on support sheet 1001 with adhesive layer 1002 placed in between.

Next, in step (S13) of FIG. 3, bumps 302 are formed in opening portions (130a) in solder resist 130 through the same process as in the first embodiment. Accordingly, bumps 302 are positioned on conductive pattern (121b) exposed through opening portions (130a) in solder resist 130.

Next, in steps (S14)~(S17) of FIG. 3, signal pattern (S) of electronic component 1000 is connected through the same process as in the first embodiment, and underfill material 201 is injected between wiring board 100 and semiconductor chip 200. Furthermore, encapsulating resin 202 is formed and support sheet 1001 (support material) is removed. Accordingly, electrode pads (200b) (the electrodes of signal pattern (S) in semiconductor chip 200) and conductive pattern (121b) (the pads of signal pattern (S) in wiring board 100) are electrically connected to each other by bumps 302. In addition, semiconductor chip 200 is coated with underfill material 201 and encapsulating resin 202. As a result, semiconductor chip 200 is encapsulated.

Next, in step (S18) of FIG. 3, power-source pattern (P) in electronic component 1000 is connected.

Figure 17:
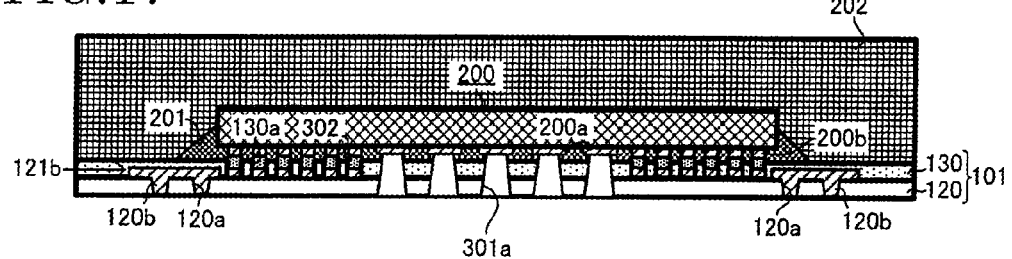
FIG. 17 is a view to illustrate a fifth step subsequent to the step in FIG. 16.

Specifically, as shown in FIG. 17, holes (301a) (via holes) are formed in insulation layer 120, solder resist 130 and underfill material 201 by irradiating laser light from the second-surface side, for example. Holes (301a) penetrate through insulation layer 120, solder resist 130 and underfill material 201 and reach electrode pads (200a) of semiconductor chip 200. Then, desmearing and soft etching are performed if required.

Next, through the same process as in the first embodiment, via conductors (301b) (filled conductors) are formed in holes (301a) and conductive pattern (121a) is formed on insulation layer 120. Furthermore, in step (S19) of FIG. 3, a buildup section is formed on the second surface of laminated section 101. Accordingly, wiring board 100 is formed and electronic component 1000 previously shown in FIG. 12 is completed.

Other Embodiments

Figure 18:
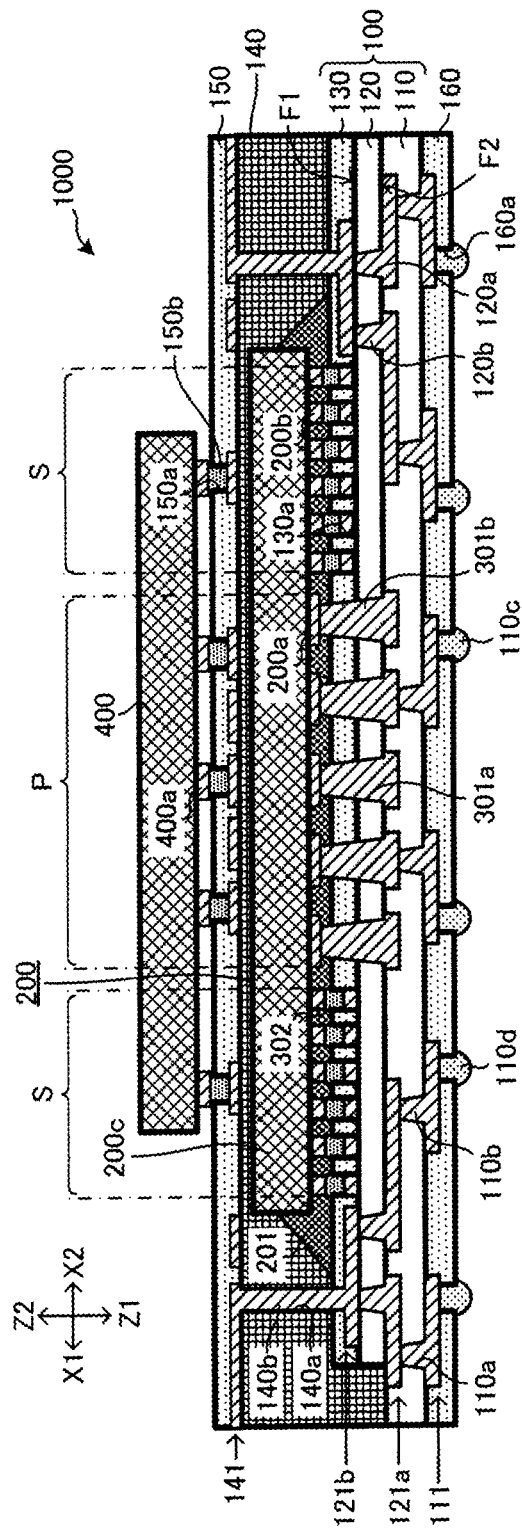
FIG. 18 is a view showing an electronic component having another semiconductor chip that is formed on the encapsulated layer and is different from the built-in semiconductor chip.

As shown in FIG. 18, for example, electronic component 1000 may also include the following: encapsulating layer 140, which is formed on the first surface of wiring board 100 using the same material as that for encapsulating resin 202 to encapsulate semiconductor chip 200; and another semiconductor chip 400 (semiconductor element) that is formed on encapsulating layer 140 and is separate from semiconductor chip 200. Such electronic component 1000 is structured to be a so-called 3D-SiP. Semiconductor chip 400 has electrode pads (400a).

In this example, bumps (110c) of power-source pattern (P) (such as solder bumps) and bumps (110d) of signal pattern (S) (such as solder bumps) are formed on the second surface of wiring board 100. Another wiring board or electronic component, for example, may be mounted on bumps (110c, 110d).

Conductive pattern 141 is formed on encapsulating layer 140. Solder resist 150 having opening portions (150a) is formed on conductive pattern 141. Solder resist 150 may be made of any of the materials previously listed for solder resist 130, for example. Conductive pattern 141 is exposed through opening portions (150a). Conductive pattern 141 (conductive pattern on encapsulating layer 140) exposed through opening portions (150a) and electrode pads (400a) of semiconductor chip 400 are electrically connected to each other through bumps (150b) (such as solder bumps).

Also, holes (140a) (via holes) reaching conductive pattern (121b) are formed in encapsulating layer 140. Then, by filling conductor (such as copper plating) in holes (140a), the conductor in holes (140a) becomes via conductors (140b) (filled conductors). Conductive pattern 141 (conductive pattern on encapsulating layer 140) and conductive pattern (121b) (conductive pattern in wiring board 100) are electrically connected to each other through via conductors (140b).

Figure 19:
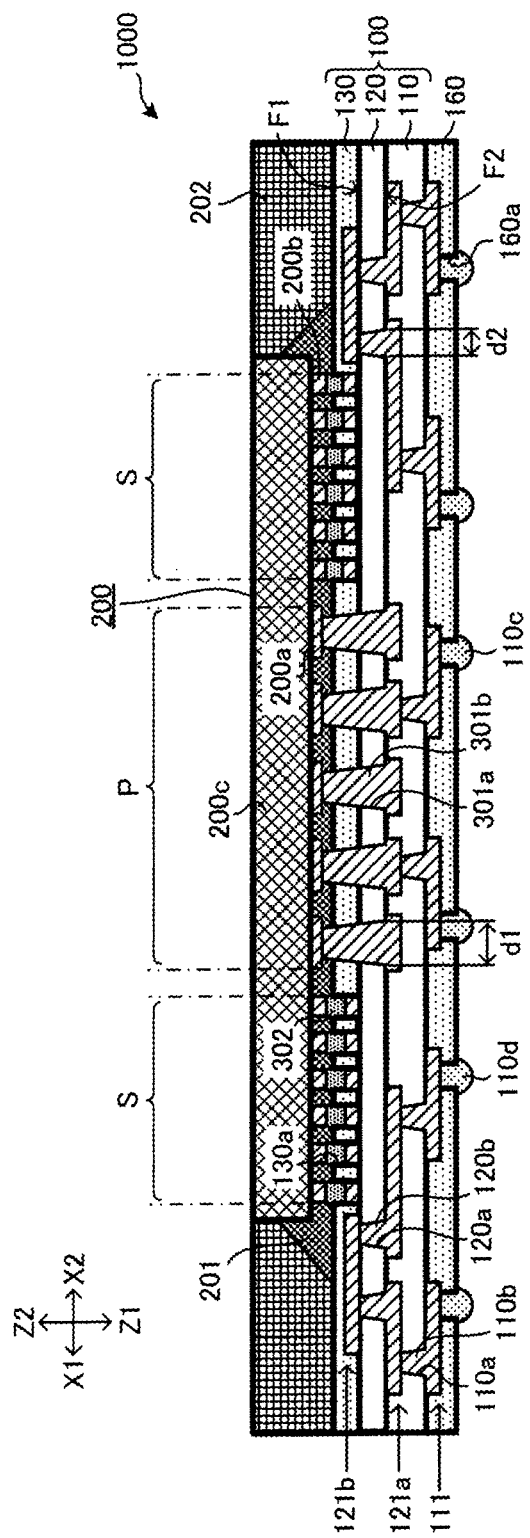
FIG. 19 is a view showing an example in which the top surface of a semiconductor chip is exposed.

Also, as shown in FIG. 19, for example, the top surface of semiconductor 200 may be exposed by polishing encapsulating resin 202 and so forth. In such a case, heat dissipation improves in semiconductor chip 200. Moreover, electronic component 1000 becomes thinner.

Regarding other factors, the structure of the above electronic component 1000 as well as the type, performance, dimensions, quality, configuration, number of layers, positioning and so forth of the elements of such a structure, may be modified freely within a scope that does not deviate from the gist of the present invention.

For example, the buildup process is further continued on the second surface of wiring board 100 from the stage shown previously in FIG. 1 to obtain a further multilayered wiring board.

The material for each conductive pattern is not limited to the above, and may be modified according to usage requirements or the like. For example, metal other than copper may be used as the material for conductive patterns. The conductor in opening portions (such as via conductors) is not limited to any specific kind, either. In addition, through-hole conductors may be used instead of via conductors. Also, the material for each insulation layer may be selected freely. For example, as for resins to form interlayer insulation layers, thermosetting resins or thermoplastic resins may be used. As for thermosetting resins, for example, other than epoxy resin and polyimide, BT resin, allyl polyphenylene ether resin (A-PPE resin) or aramid resin may be used, for example. Also, as for thermoplastic resins, for example, liquid-crystal polymer (LCP), PEEK resin or PTFE resin (fluoro resin) may be used. Such materials are preferred to be selected according to requirements from the viewpoint of insulation, dielectric properties, tolerance to heat, mechanical features and so forth. In addition, the above resins may contain additives such as a curing agent, a stabilizer, filler or the like. Alternatively, each conductive pattern and each insulation layer may be formed with multiple layers made of different materials.

The method for manufacturing electronic components is not limited to the order and contents shown in the flowchart of FIG. 3; the order and contents may be modified freely within a scope that does not deviate from the gist of the present invention. Also, depending on usage requirements or the like, some steps may be omitted.

For example, instead of a laser, wet or dry etching may be employed for processing. When processing by etching, portions required to remain are preferred to be protected in advance with resist or the like.

The above embodiments and modified examples may be combined freely. It is preferred to select an appropriate combination according to usage requirements or the like. For example, the structure shown earlier in FIG. 18 may be applied to those structures shown previously in FIG. 1, FIG. 12 and FIG. 19.

An electronic component according to one aspect of the present invention has the following: a wiring board having a power-source pattern and a signal pattern; a semiconductor element mounted on the wiring board and having a power-source electrode pad and a signal electrode pad; a first connection portion connecting the signal pattern and the signal electrode pad; and a second connection portion connecting the power-source pattern and the power-source electrode pad. In such an electronic component, the electrical resistance of the material for the second connection portion is set lower than the electrical resistance of the material for the first connection portion.

A method for manufacturing an electronic component according to another aspect of the present invention includes the following: preparing a support material; forming an insulation layer on the support material; forming a first conductive pattern on a first surface of the insulation layer; forming a first connection portion on the first conductive pattern; electrically connecting the first conductive pattern and a signal electrode pad of a semiconductor element through the first connection portion; filling underfill material between the semiconductor element and the insulation layer; removing the support material; forming an opening portion which penetrates through the insulation layer and reaches a power-source electrode pad of the semiconductor element; and forming a second conductive pattern on a second surface of the insulation layer while forming in the opening portion a second connection portion which connects the second conductive pattern and the power-source electrode pad. The second connection portion is formed with a material having lower electrical resistance than the material for the first connection portion.

Obviously, numerous modifications and variations of the present invention are possible in light of the above teachings. It is therefore to be understood that within the scope of the appended claims, the invention may be practiced otherwise than as specifically described herein.

What is claimed is:

1. An electronic component, comprising:
    a wiring board having a power-source pattern and a signal pattern;
    a semiconductor element mounted on the wiring board and having a power-source electrode pad and a signal electrode pad;
    a first connection portion comprising a conductive material and connecting the signal pattern of the wiring board and the signal electrode pad of the semiconductor element; and
    a second connection portion comprising a conductive material and connecting the power-source pattern of the wiring board and the power-source electrode pad of the semiconductor element,
    wherein the conductive material of the first connection portion and the conductive material of the second connection portion are selected such that the conductive material of the second connection portion has an electrical resistance which is lower than an electrical resistance of the conductive material of the first connection portion.

2. The electronic component according to claim 1, wherein the wiring board comprises an insulation layer having a first surface on a side where the semiconductor element is mounted and a second surface on an opposite side of the first surface, a first conductive pattern formed on the first surface of the insulation layer, a second conductive pattern formed on the second surface of the insulation layer, and a first via conductor connecting the first conductive pattern and the second conductive pattern.

3. The electronic component according to claim 2, wherein the second connection portion comprises a second via conductor which connects the second conductive pattern and the power-source electrode pad.

4. The electronic component according to claim 3, wherein the first via conductor of the first connection portion has a width which is set greater than a width of the second via conductor.

5. The electronic component according to claim 3, wherein the first via conductor and the second via conductor taper in a same direction.

6. The electronic component according to claim 3, further comprising an underfill material filled in a space between the wiring board and the semiconductor element, and the second via conductor of the second connection portion penetrates through the underfill material.

7. The electronic component according to claim 2, wherein the second conductive pattern includes the power-source pattern and the signal pattern.

8. The electronic component according to claim 2, wherein the first conductive pattern includes the signal pattern.

9. The electronic component according to claim 2, wherein the second connection portion is positioned in an approximate central portion of a projected region of the semiconductor element.

10. The electronic component according to claim 2, wherein the wiring board comprises a second insulation layer formed on the second surface of the insulation layer and the second conductive pattern, a third conductive pattern formed on the second insulation layer, a third via conductor connecting the third conductive pattern and the second conductive pattern, and a third connection portion formed on the third conductive pattern.

11. The electronic component according to claim 1, wherein the first connection portion is made of solder, and the second connection portion is made of copper.

12. The electronic component according to claim 1, wherein the first connection portion is formed in a plurality, and the plurality of first connection portions are formed at a pitch of 90 μm or narrower.

13. A method for manufacturing an electronic component, comprising:
    forming a first conductive pattern on a first surface of an insulation layer;
    forming a first connection portion comprising a conductive material on the first conductive pattern;
    positioning on the insulation layer a semiconductor element having a signal electrode pad and a power-source electrode pad such that the signal electrode pad of a semiconductor element is electrically connected to the first conductive pattern through the first connection portion;
    filling an underfill material in a space between the semiconductor element and the insulation layer;
    forming an opening portion which penetrates through the insulation layer and reaches the power-source electrode pad of the semiconductor element;

forming in the opening portion a second connection portion comprising a conductive material such that the second conductive pattern is connected to the power-source electrode pad; and forming a second conductive pattern on a second surface of the insulation layer, wherein the conductive material of the first connection portion and the conductive material of the second connection portion are selected such that the conductive material of the second connection portion has an electrical resistance which is lower than an electrical resistance of the conductive material of the first connection portion.

14. The method for manufacturing an electronic component according to claim 13, further comprises:

preparing a support material;

forming the insulation layer on the support material; and removing the support material prior to the forming of the opening portion which penetrates through the insulation layer and reaches the power-source electrode pad of the semiconductor element.

15. The method for manufacturing an electronic component according to claim 13, wherein the second connection portion is formed while the second conductive pattern is formed in a same process.

16. The method for manufacturing an electronic component according to claim 13, wherein the forming of the first connection portion comprises forming a copper via conductor.

17. The method for manufacturing an electronic component according to claim 13, wherein the forming of the second connection portion comprises forming a solder bump.

* * * * *